United States Patent
Xu (10) Patent No.: US 9,570,034 B2
(45) Date of Patent: Feb. 14, 2017

(54) PIXEL CELL CIRCUITS OF COMPENSATION FEEDBACK VOLTAGE

(71) Applicant: Shenzhen China Star Optoelectronics Technology Co., Ltd., Shenzhen (CN)

(72) Inventor: Hongyuan Xu, Shenzhen (CN)

(73) Assignee: SHENZHEN CHINA STAR OPTOELECTRONICS TECHNOLOGY CO., LTD., Shenzhen, Guandong (CN)

(*) Notice: Subject to any disclaimer, the term of this patent is extended or adjusted under 35 U.S.C. 154(b) by 0 days.

(21) Appl. No.: 14/778,088

(22) PCT Filed: Aug. 21, 2015

(86) PCT No.: PCT/CN2015/087722
§ 371 (c)(1),
(2) Date: Sep. 18, 2015

(65) Prior Publication Data
US 2017/0018246 A1    Jan. 19, 2017

(30) Foreign Application Priority Data

Jul. 17, 2015 (CN) .......................... 2015 1 0423481

(51) Int. Cl.
*G09G 3/36* (2006.01)
*G02F 1/1343* (2006.01)
(Continued)

(52) U.S. Cl.
CPC ........... *G09G 3/3696* (2013.01); *G02F 1/1368* (2013.01); *G02F 1/13439* (2013.01);
(Continued)

(58) Field of Classification Search
CPC ................ G09G 3/00; G09G 2300/046; G09G 2300/0465; G09G 2300/0469; G09G 2300/0478; G09G 2300/0819; G09G 2300/0876; G09G 3/36; G09G 2300/0439; G09G 2330/021; G09G 3/0416; G09G 3/3648
(Continued)

(56) References Cited

U.S. PATENT DOCUMENTS 4,621,260 A * 11/1986 Suzuki ............. G02F 1/136213
                                                    257/E27.111
2016/0035287 A1* 2/2016 Merkin ................ G09G 3/3611
                                                    345/205

* cited by examiner

*Primary Examiner* — Jennifer Nguyen
(74) *Attorney, Agent, or Firm* — Leong C. Lei (57) ABSTRACT

The present disclosure relates to a pixel cell circuit of compensation feedback voltage. The pixel cell circuit is provided with the compensation capacitance (C_co), one end of the compensation capacitance (C_co) electrically connects to the compensation level wirings G(m)_co, and the other end of the compensation capacitance (C_co) electrically connects to the drain of the TFT (T1) and the pixel electrode (P). A level of the compensation signals transmitted by the compensation level wirings G(m)_co is opposite to the level of the scanning signals transmitted by the scanning lines G(m). When the pixel electrode has been fully charged, the compensation capacitance generates a pull-up feedback voltage for compensating the pull-down voltage caused by the parasitic capacitance so as to eliminate the effects toward the pixel electrodes caused by the scanning signals transmitted by the scanning lines. This configuration not only decreases the flickers, but also the image sticking. In brief, the display uniformity and the display performance are enhanced.

14 Claims, 6 Drawing Sheets

(51) Int. Cl.
*G02F 1/1368* (2006.01)
*G02F 1/1362* (2006.01)
*H01L 27/12* (2006.01)

(52) U.S. Cl.
CPC .. *G02F 1/134336* (2013.01); *G02F 1/136286* (2013.01); *G09G 3/3677* (2013.01); *G09G 3/3688* (2013.01); *H01L 27/124* (2013.01); *G02F 2201/123* (2013.01); *G09G 2300/0426* (2013.01); *G09G 2300/0819* (2013.01); *G09G 2320/0247* (2013.01)

(58) Field of Classification Search
USPC .............................................. 345/87–89, 204
See application file for complete search history.

PIXEL CELL CIRCUITS OF COMPENSATION FEEDBACK VOLTAGE

BACKGROUND OF THE INVENTION

1. Field of the Invention

The present disclosure relates to liquid crystal display technology, and more particularly to a pixel cell circuit of compensation feedback voltage.

2. Discussion of the Related Art

LCDs typically are characterized by attributes including thin, power-saving, and low radiation, and thus have been widely adopted by electronic devices, such as liquid crystal televisions, mobile phones, personal digital assistant (PDA), digital cameras, and monitors for computers and notebooks. The LCD is dominant in the flat display field.

Currently, LCDs are mainly backlight type, which may include a housing, a liquid crystal panel and a backlight module arranged within the housing. The liquid crystal panel is the key component of the LCD. However, the liquid crystal panel needs the light source provided by the backlight module to display images.

The liquid crystal panel usually includes a color filter (CF), a Thin Film Transistor Array Substrate (TFT Array Substrate), and a liquid Crystal Layer between the two substrates. Pixel electrodes and common electrodes are arranged at internal surfaces of the two substrates facing toward each other. The alignment of the liquid crystal molecules may be changed by applying the voltage to the liquid crystal molecules such that the light beams from the backlight module are reflected to generate the images. The array substrate may include a plurality of pixels arranged in a matrix. Each of the pixels includes Thin Film Transistor (TFT) to control the voltage of the pixel electrode so as to change the rotating angle of the liquid crystal. As such, the density of the optical field may be controlled.

There are a variety of structures of the TFTs. Currently, most of the LCDs adopt bottom-gate structure. The gate and the source/drain are overlapped in the bottom of the TFT, and parasitic capacitance (Cgs) may be generated in the overlapped area.

Figure 1:
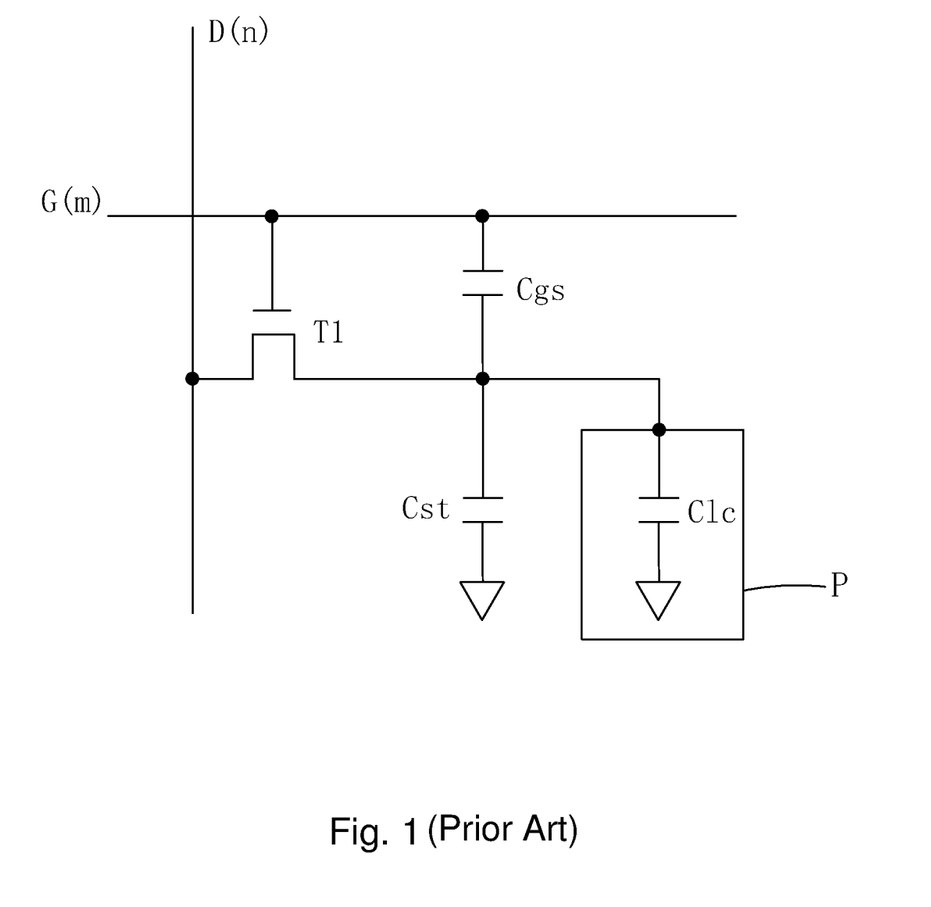
FIG. 1 is a circuit diagram of the conventional pixel cell circuit.

FIG. 1 is a circuit diagram of the conventional pixel cell circuit. The pixel cell circuit includes the TFT (T1). The gate of the TFT (T1) electrically connects with the scanning line G(m) corresponding to row of the pixel cell, the source of the TFT (T1) electrically connects with the data line D(n) corresponding to the column of the pixel cell, and the drain electrically connects with the pixel electrode (P). Two ends of the parasitic capacitance (Cgs) electrically connects with the gate and the drain of the TFT (T1). One end of a storage capacitance (Cst) electrically connects with the drain of the TFT (T1), and the other end of the storage capacitance (Cst) connects with a constant voltage. One end of the liquid crystal capacitor (Clc) electrically connect to the drain of the TFT (T1), and the other end of the liquid crystal capacitor (Clc) connects with the constant voltage.

Figure 2:
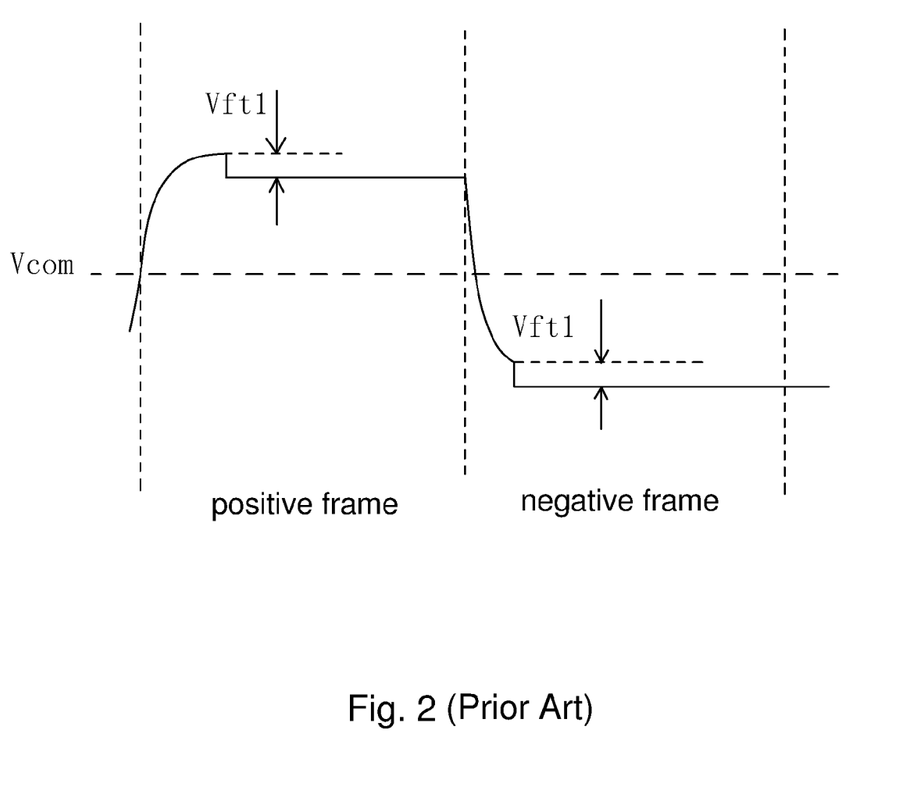
FIG. 2 is a sectional view showing the voltage waveform of the pixel electrode within the conventional pixel cell circuit.

The voltage of the pixel electrode (P) may be interfered by the level of the gate of the TFT (T1) due to the parasitic capacitance (Cgs). Also referring to FIG. 2, when the pixel electrode (P) has been charged fully, the level of the gate of the TFT (T1) is pulled down instantly. The voltage of the pixel electrode (P) may also be pulled down due to the capacitance coupling effect. As such, one feedthrough voltage (Vft1) is generated, and the magnitude of the feedthrough voltage (Vft1) may be represented by the equation below:

$$Vft1 = (Vgh - Vgl) \times Cgs / Ctotal$$

Wherein Vgh represents the high level of the scanning signals transmitted by the scanning line G(m), Vgl represents the low level of the scanning signals transmitted by the scanning line G(m), Ctotal represents a sum of the capacitance connected by the pixel electrode (P), including the liquid crystal capacitor (Clc), the storage capacitance (Cst), and the parasitic capacitance (Cgs).

The voltage of the positive and negative frames of the pixel electrode (P) may be affected by the parasitic capacitance (Cgs), which results in asymmetric voltage of the positive and negative frames. This may cause problems such as flicker and image sticking, and thus the display performance may be affected. In addition, the RC delay with respect to different areas of the panel may also cause the difference of the feedback voltage. This may result in non-uniform voltage of the common electrode (Vcom), and may cause serious flicker.

SUMMARY

The object of the invention is to provide a pixel cell circuit of compensation feedback voltage for compensating the feedback voltage resulting from the parasitic capacitance. This configuration not only decreases the flickers, but also the image sticking. In brief, the display uniformity and the display performance are enhanced.

In one aspect, a pixel cell circuit of the compensation feedback voltage includes: a TFT, a gate of the TFT electrically connecting to a scanning line corresponding to a row of the pixel cell, a source of the TFT electrically connecting to a data line corresponding to a column of the pixel cell, and a drain of the TFT electrically connecting to a pixel electrode; the pixel electrode electrically connecting to the drain of the TFT; a parasitic capacitance, one end of the parasitic capacitance electrically connecting to the gate of the TFT, and the other end of the parasitic capacitance electrically connecting to the drain of the TFT and the pixel electrode; a compensation capacitance, one end of the compensation capacitance electrically connecting to the compensation level wirings, and the other end of the compensation capacitance electrically connecting to the drain of the TFT and the pixel electrode; and compensation level wirings, a level of the compensation signals transmitted by the compensation level wirings being opposite to the level of the scanning signals transmitted by the scanning lines.

Wherein the pixel cell circuit further includes an inverter, an input end of the inverter electrically connects to the scanning line, and the output end of the inverter electrically connects to the compensation level wirings.

Wherein the pixel cell circuit further includes a storage capacitance and a liquid crystal capacitor, one end of the storage capacitance electrically connects to the drain of the TFT, and the other end of the storage capacitance connects to a constant voltage, and one end of the liquid crystal capacitor electrically connects to the drain of the TFT, and the other end of the liquid crystal capacitor electrically connects to the constant voltage.

Wherein the compensation level wirings, the gate of the TFT, and the scanning line are on the same layer, and the compensation capacitance is constituted by compensation level wirings and a drain of the TFT.

Wherein the compensation level wirings, the gate of the TFT, and the scanning line are on the same layer, and the compensation capacitance is constituted by compensation level wirings and a drain of the TFT.

Wherein the pixel electrode is ITO electrode.

Wherein $C\_co \times V\_co = (Vgh - Vgl) \times Cgs$;

wherein C_co represents a compensation capacitance, V_co represents a voltage difference between the high and low level of the compensation signals transmitted by the compensation level wirings, Vgh represents the high level of the scanning signals transmitted by the signal line, Vgl represents the low level of the scanning signals transmitted by the signal lines, and Cgs represents parasitic capacitance.

Wherein:

$$V\_co = Vgh - Vgl; \text{ and } C\_co = Cgs.$$

Wherein:

$$V\_co < Vgh - Vgl; \text{ and } C\_co > Cgs.$$

In another aspect, a pixel cell circuit of the compensation feedback voltage includes: a TFT, a gate of the TFT electrically connecting to a scanning line corresponding to a row of the pixel cell, a source of the TFT electrically connecting to a data line corresponding to a column of the pixel cell, and a drain of the TFT electrically connecting to a pixel electrode; the pixel electrode electrically connecting to the drain of the TFT; a parasitic capacitance, one end of the parasitic capacitance electrically connecting to the gate of the TFT, and the other end of the parasitic capacitance electrically connecting to the drain of the TFT and the pixel electrode; a compensation capacitance, one end of the compensation capacitance electrically connecting to the compensation level wirings, and the other end of the compensation capacitance electrically connecting to the drain of the TFT and the pixel electrode; compensation level wirings, a level of the compensation signals transmitted by the compensation level wirings being opposite to the level of the scanning signals transmitted by the scanning lines; an inverter, an input end of the inverter electrically connecting to the scanning line, and the output end of the inverter electrically connecting to the compensation level wirings; a storage capacitance and a liquid crystal capacitor, one end of the storage capacitance electrically connecting to the drain of the TFT, and the other end of the storage capacitance connecting to a constant voltage, and one end of the liquid crystal capacitor electrically connecting to the drain of the TFT, and the other end of the liquid crystal capacitor electrically connecting to the constant voltage;

$C\_co \times V\_co = (Vgh - Vgl) \times Cgs$; and wherein C_co represents a compensation capacitance, V_co represents a voltage difference between the high and low level of the compensation signals transmitted by the compensation level wirings, Vgh represents the high level of the scanning signals transmitted by the signal line, Vgl represents the low level of the scanning signals transmitted by the signal lines, and Cgs represents parasitic capacitance.

In view of the above, the pixel cell circuit of compensation feedback voltage is configured with the compensation capacitance. One end of the compensation capacitance electrically connects with the wiring of the compensation level, and the other end of the compensation capacitance electrically connects with the pixel electrode. The level of the compensation signals transmitted by the compensation level wiring is opposite to the level of the scanning signals transmitted by the signal lines. When the pixel electrode has been fully charged, the compensation capacitance generates a pull-up feedback voltage for compensating the pull-down voltage caused by the parasitic capacitance so as to eliminate the effects toward the pixel electrodes caused by the scanning signals transmitted by the scanning lines. This configuration not only decreases the flickers, but also the image sticking. In brief, the display uniformity and the display performance are enhanced.

In order to further understand the characteristics of the invention as well as technical content, see the following detailed description of the present invention and the accompanying drawings, drawings, however, for reference purposes only and description of use is not intended to limit the present invention.

BRIEF DESCRIPTION OF THE DRAWINGS

Below in conjunction with the accompanying drawings, through a specific embodiment of the present invention is described in detail, and will make apparent the technical solution of the present invention, and other beneficial effects.

DETAILED DESCRIPTION OF THE EMBODIMENTS

Embodiments of the invention will now be described more fully hereinafter with reference to the accompanying drawings, in which embodiments of the invention are shown.

Figure 3:
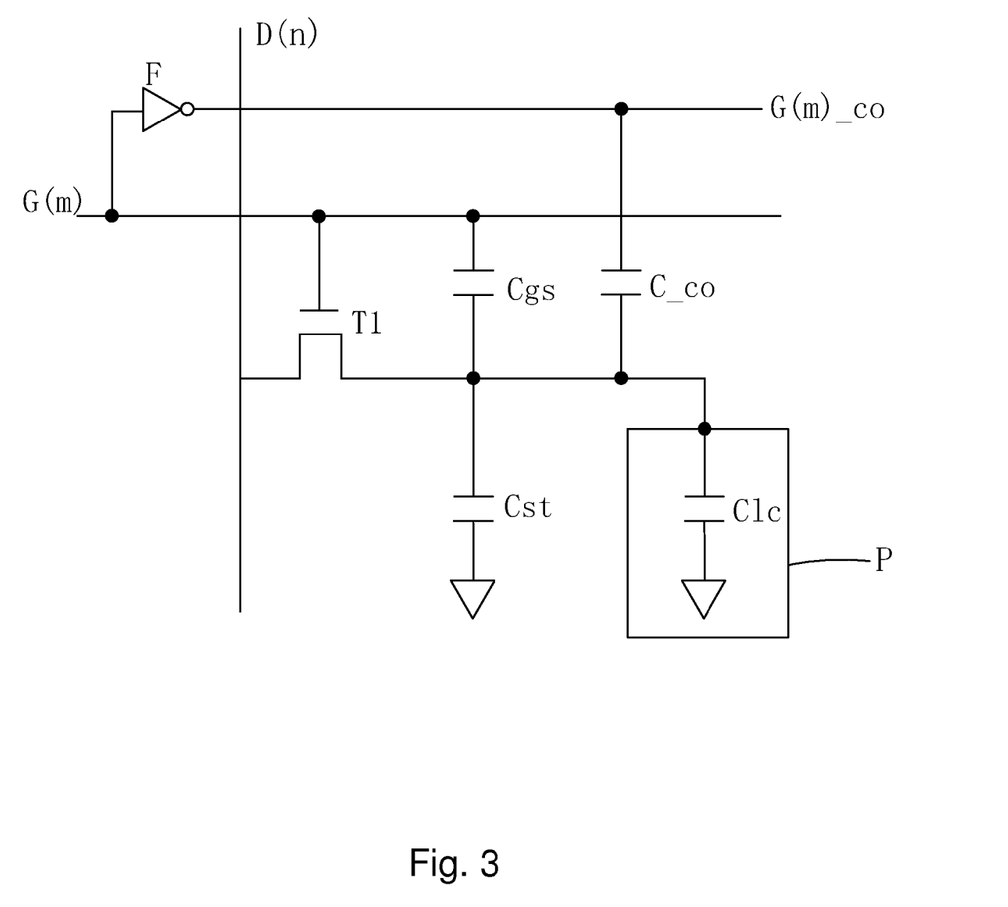
FIG. 3 is a circuit diagram of the pixel cell circuit of the compensation feedback voltage in accordance with one embodiment.

FIG. 3 is a circuit diagram of the pixel cell circuit of the compensation feedback voltage in accordance with one embodiment. The pixel cell circuit includes a TFT (T1), a pixel electrode (P), a parasitic capacitance (Cgs), a compensation capacitance (C_co), and compensation level wirings G(m)_co.

A gate of the TFT (T1) electrically connects to the scanning line G(m) corresponding to a row of the pixel cell, a source of the TFT (T1) electrically connects to the data line D(n) corresponding to a column of the pixel cell, and a drain of the TFT (T1) electrically connects to the pixel electrode (P).

The pixel electrode (P) electrically connects to the drain of the TFT (T1).

One end of the parasitic capacitance (Cgs) electrically connects to the gate of the TFT (T1), and the other end of the parasitic capacitance (Cgs) electrically connects to the drain of the TFT (T1) and the pixel electrode (P).

One end of the compensation capacitance (C_co) electrically connects to the compensation level wirings G(m)_co, and the other end of the compensation capacitance (C_co) electrically connects to the drain of the TFT (T1) and the pixel electrode (P).

In addition, the level of the compensation level wirings G(m)_co and the level of the compensation signals transmitted by the compensation level wirings G(m)_co are opposite to the level of the scanning signals transmitted by the scanning lines G(m).

Figure 5:
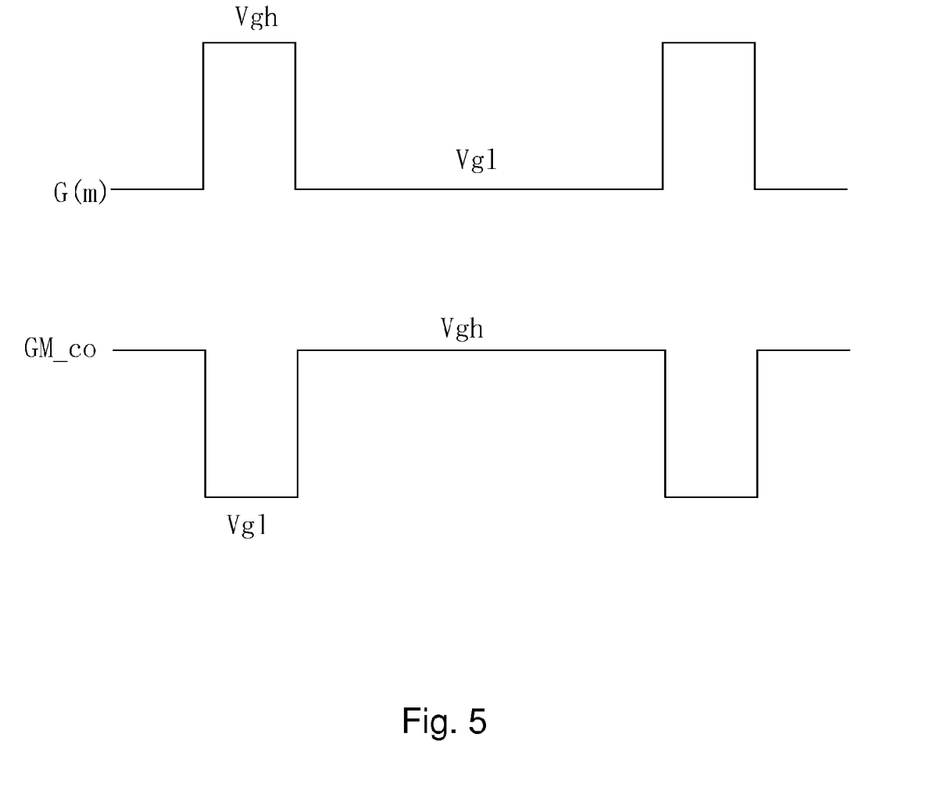
FIG. 5 is a waveform diagram of the compensation signals transmitted by the compensation level wirings and the scanning signals transmitted by the signal lines of the pixel cell circuit of the compensation feedback voltage in accordance with one embodiment.

In addition, an inverter (F) is configured such that the level of the compensation signals transmitted by the compensation level wirings G(m)_co is opposite to that of the scanning signals transmitted by the scanning line G(m). The input end of the inverter (F) electrically connects to the scanning line G(m), and the output end of the inverter (F) electrically connects to the compensation level wirings G(m)_co. As shown in FIG. 5, when the scanning signals transmitted by the scanning line G(m) is at high level (Vgh), after being inverted by the inverter (F), the compensation signals transmitted by the compensation level wirings G(m)_ co is at low level (Vgl). Correspondingly, when the scanning signals transmitted by the scanning line G(m) is at low level (Vgl), after being inverted by the inverter (F), the compensation signals transmitted by the compensation level wirings G(m)_co is at high level (Vgh).

In the embodiment, the pixel cell circuit of the compensation feedback voltage also includes a storage capacitance (Cst) and a liquid crystal capacitor (Clc). One end of the storage capacitance (Cst) electrically connects to the drain of the TFT (T1), and the other end of the storage capacitance (Cst) connects to a constant voltage. One end of the liquid crystal capacitor (Clc) electrically connects to the drain of the TFT (T1), and the other end of the liquid crystal capacitor (Clc) electrically connects to the constant voltage.

In the embodiment, the compensation level wirings G(m)_ co, the gate of the TFT (T1), and the scanning line G(m) are on the same layer. That is, the above are covered by the gate insulation layer. With respect to the manufacturing process, the compensation level wirings G(m)_co, the gate of the TFT (T1), and the scanning line G(m) are manufactured by patterning the first metallic layer. The source and the drain of the TFT (T1) are manufactured by patterning the second metallic layer. The pixel electrode (P) is the ITO electrode.

Figure 4:
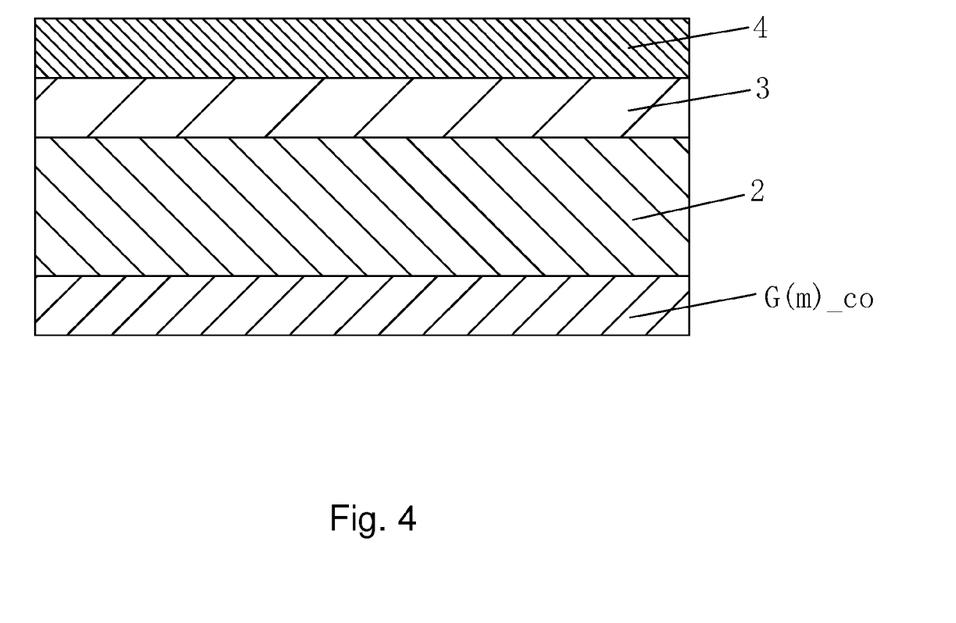
FIG. 4 is a sectional view of the compensation capacitance within the pixel cell circuit of the compensation feedback voltage in accordance with one embodiment.

As shown in FIG. 4, the compensation capacitance (C_co) may be constituted by compensation level wirings G(m)_co and the drain 4 of the TFT (T1). A gate insulation layer 2 and a source layer 3 are provided between the compensation level wirings G(m)_co and the TFT (T1).

The compensation capacitance (C_co) may be constituted by the compensation level wirings G(m)_co and the pixel electrode (P).

Figure 6:
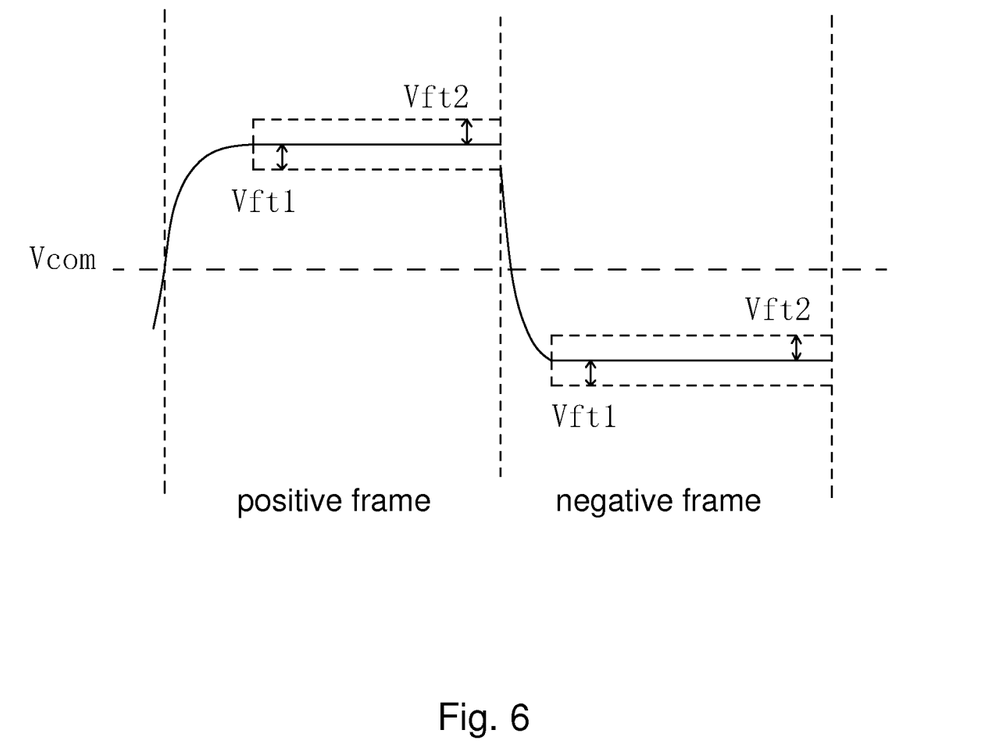
FIG. 6 is a sectional view of the voltage waveform of the pixel electrode of the pixel cell circuit of the compensation feedback voltage in accordance with one embodiment.

Referring to FIGS. 2, 5 and 6, after the pixel electrode (P) is fully charged, the scanning signals transmitted by the scanning line G(m) transits from the high level (Vgh) to the low level (Vgl). The gate level of the TFT (T1) is pulled down. The voltage of the pixel electrode (P) is also pulled down due to the parasitic capacitance (Cgs) so as to generate a pull-down feedback voltage (Vft1). At the same time, due to the operations of the inverter (F), the level of the compensation signals transmitted by the compensation level wirings G(m)_co transits from the low level (Vgl) to the high level (Vgh). The voltage of the pixel electrode (P) generates a pull-up feedback voltage (Vft2) as being affected by the compensation capacitance (C_co). The magnitude of the pull-up feedback voltage (Vft2) equals to the pull-down feedback voltage (Vft1) such that the voltage of the pixel electrode (P) remains the same. That is, the pull-up feedback voltage (Vft2) generated by the compensation capacitance (C_co) compensates the pull-down feedback voltage (Vft1) caused by the parasitic capacitance (Cgs), which prevents the pixel electrode (P) from being affected by the scanning signals transmitted by the scanning line G(m). This configuration not only decreases the flickers, but also the image sticking. In brief, the display uniformity and the display performance are enhanced Further, the magnitude of the compensation capacitance (C_co) may be configured to be the same with the parasitic capacitance (Cgs). At the same time, the voltage difference (V_Co) between the high and low level of the compensation signals transmitted by the compensation level wirings G(m)_co equals to the voltage difference between the high level (Vgh) and the low level (Vgl) of the scanning signals transmitted by the scanning line G(m). That is:

$$V\_co = Vgh - Vgl; \text{ and}$$

$$C\_co = Cgs;$$

In order to decrease the loading of the scanning line G(m), the voltage difference (V_Co) between the high and low level of the compensation signals transmitted by the compensation level wirings G(m)_co may be configured to be smaller than the voltage difference between the high level (Vgh) and the low level (Vgl) of the scanning signals transmitted by the scanning line G(m), which may be accomplished by increasing the compensation capacitance (C_co).

$$V\_co < Vgh - Vgl;$$

$$C\_co > Cgs;$$

As long as the equation below is guaranteed.

$$C\_co \times V\_co = (Vgh - Vgl) \times Cgs$$

In view of the above, the pixel cell circuit of compensation feedback voltage is configured with the compensation capacitance. One end of the compensation capacitance electrically connects with the wiring of the compensation level, and the other end of the compensation capacitance electrically connects with the pixel electrode. The level of the compensation signals transmitted by the compensation level wiring is opposite to the level of the scanning signals transmitted by the signal lines. When the pixel electrode has been fully charged, the compensation capacitance generates a pull-up feedback voltage for compensating the pull-down voltage caused by the parasitic capacitance so as to eliminate the effects toward the pixel electrodes caused by the scanning signals transmitted by the scanning lines. This configuration not only decreases the flickers, but also the image sticking. In brief, the display uniformity and the display performance are enhanced.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A pixel cell circuit of the compensation feedback voltage, comprising:
   a TFT, a gate of the TFT electrically connecting to a scanning line corresponding to a row of the pixel cell, a source of the TFT electrically connecting to a data line corresponding to a column of the pixel cell, and a drain of the TFT electrically connecting to a pixel electrode;
   the pixel electrode electrically connecting to the drain of the TFT;

a parasitic capacitance, one end of the parasitic capacitance electrically connecting to the gate of the TFT, and the other end of the parasitic capacitance electrically connecting to the drain of the TFT and the pixel electrode;

a compensation capacitance, one end of the compensation capacitance electrically connecting to the compensation level wirings, and the other end of the compensation capacitance electrically connecting to the drain of the TFT and the pixel electrode; and compensation level wirings, a level of the compensation signals transmitted by the compensation level wirings being opposite to the level of the scanning signals transmitted by the scanning lines; and wherein $C\_co \times V\_co = (Vgh - Vgl) \times Cgs$;

wherein $C\_co$ represents a compensation capacitance, $V\_co$ represents a voltage difference between the high and low level of the compensation signals transmitted by the compensation level wirings, Vgh represents the high level of the scanning signals transmitted by the signal line, Vgl represents the low level of the scanning signals transmitted by the signal lines, and Cgs represents parasitic capacitance.

2. The pixel cell circuit of the compensation feedback voltage as claimed in claim 1, wherein the pixel cell circuit further comprises an inverter, an input end of the inverter electrically connects to the scanning line, and the output end of the inverter electrically connects to the compensation level wirings.

3. The pixel cell circuit of the compensation feedback voltage as claimed in claim 1, wherein the pixel cell circuit further comprises a storage capacitance and a liquid crystal capacitor, one end of the storage capacitance electrically connects to the drain of the TFT, and the other end of the storage capacitance connects to a constant voltage, and one end of the liquid crystal capacitor electrically connects to the drain of the TFT, and the other end of the liquid crystal capacitor electrically connects to the constant voltage.

4. The pixel cell circuit of the compensation feedback voltage as claimed in claim 2, wherein the compensation level wirings, the gate of the TFT, and the scanning line are on the same layer, and the compensation capacitance is constituted by compensation level wirings and a drain of the TFT.

5. The pixel cell circuit of the compensation feedback voltage as claimed in claim 1, wherein the compensation level wirings, the gate of the TFT, and the scanning line are on the same layer, and the compensation capacitance is constituted by compensation level wirings and a drain of the TFT.

6. The pixel cell circuit of the compensation feedback voltage as claimed in claim 5, wherein the pixel electrode is ITO electrode.

7. The pixel cell circuit of the compensation feedback voltage as claimed in claim 1, wherein:

$$V\_co = Vgh - Vgl; \text{ and}$$

$$C\_co = Cgs.$$

8. The pixel cell circuit of the compensation feedback voltage as claimed in claim 1, wherein:

$$V\_co < Vgh - Vgl; \text{ and}$$

$$C\_co > Cgs.$$

9. A pixel cell circuit of the compensation feedback voltage, comprising:

a TFT, a gate of the TFT electrically connecting to a scanning line corresponding to a row of the pixel cell, a source of the TFT electrically connecting to a data line corresponding to a column of the pixel cell, and a drain of the TFT electrically connecting to a pixel electrode;

the pixel electrode electrically connecting to the drain of the TFT;

a parasitic capacitance, one end of the parasitic capacitance electrically connecting to the gate of the TFT, and the other end of the parasitic capacitance electrically connecting to the drain of the TFT and the pixel electrode;

a compensation capacitance, one end of the compensation capacitance electrically connecting to the compensation level wirings, and the other end of the compensation capacitance electrically connecting to the drain of the TFT and the pixel electrode;

compensation level wirings, a level of the compensation signals transmitted by the compensation level wirings being opposite to the level of the scanning signals transmitted by the scanning lines;

an inverter, an input end of the inverter electrically connecting to the scanning line, and the output end of the inverter electrically connecting to the compensation level wirings;

a storage capacitance and a liquid crystal capacitor, one end of the storage capacitance electrically connecting to the drain of the TFT, and the other end of the storage capacitance connecting to a constant voltage, and one end of the liquid crystal capacitor electrically connecting to the drain of the TFT, and the other end of the liquid crystal capacitor electrically connecting to the constant voltage;

$$C\_co \times V\_co = (Vgh - Vgl) \times Cgs; \text{ and}$$

wherein $C\_co$ represents a compensation capacitance, $V\_co$ represents a voltage difference between the high and low level of the compensation signals transmitted by the compensation level wirings, Vgh represents the high level of the scanning signals transmitted by the signal line, Vgl represents the low level of the scanning signals transmitted by the signal lines, and Cgs represents parasitic capacitance.

10. The pixel cell circuit of the compensation feedback voltage as claimed in claim 9, wherein the compensation level wirings, the gate of the TFT, and the scanning line are on the same layer, and the compensation capacitance is constituted by compensation level wirings and a drain of the TFT.

11. The pixel cell circuit of the compensation feedback voltage as claimed in claim 9, wherein the compensation level wirings, the gate of the TFT, and the scanning line are on the same layer, and the compensation capacitance is constituted by compensation level wirings and at least one pixel electrode.

12. The pixel cell circuit of the compensation feedback voltage as claimed in claim 11, wherein the pixel electrode is ITO electrode.

13. The pixel cell circuit of the compensation feedback voltage as claimed in claim 9, wherein:

$$V\_co = Vgh - Vgl; \text{ and}$$

$$C\_co = Cgs.$$

14. The pixel cell circuit of the compensation feedback voltage as claimed in claim 9, wherein:

$V\_co < Vgh - Vgl$; and $C\_co > Cgs$.

* * * * *